United States Patent
Wanlass

(10) Patent No.: US 8,691,663 B2
(45) Date of Patent: Apr. 8, 2014

(54) METHODS OF MANIPULATING STRESSED EPISTRUCTURES

(75) Inventor: Mark W. Wanlass, Golden, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 1188 days.

(21) Appl. No.: 12/613,863

(22) Filed: Nov. 6, 2009

(65) Prior Publication Data

US 2011/0108097 A1 May 12, 2011

(51) Int. Cl.
*H01L 21/30* (2006.01)
*H01L 31/18* (2006.01)
*H01L 31/0352* (2006.01)
*H01L 21/02* (2006.01)

(52) U.S. Cl.
CPC ........ *H01L 31/1892* (2013.01); *H01L 31/0352* (2013.01); *H01L 21/02035* (2013.01)
USPC .......................................... 438/457; 438/458

(58) Field of Classification Search
None
See application file for complete search history.

(56) References Cited

U.S. PATENT DOCUMENTS

| | | | | |
|---|---|---|---|---|
| 3,808,674 A | * | 5/1974 | Francombe et al. | 117/94 |
| 4,717,790 A | * | 1/1988 | Gochermann | 136/251 |
| 4,883,561 A | * | 11/1989 | Gmitter et al. | 438/27 |
| 5,071,785 A | * | 12/1991 | Nakazato et al. | 438/457 |
| 5,650,363 A | * | 7/1997 | Endroes et al. | 438/57 |
| 5,801,084 A | * | 9/1998 | Beasom et al. | 438/457 |
| 6,027,958 A | * | 2/2000 | Vu et al. | 438/110 |
| 6,051,063 A | * | 4/2000 | Tanabe et al. | 117/89 |
| 6,500,759 B1 | * | 12/2002 | Asakawa | 438/683 |
| 6,576,990 B2 | * | 6/2003 | Flesher et al. | 257/679 |
| 6,974,521 B2 | * | 12/2005 | Schermer | 156/247 |
| 6,987,028 B2 | * | 1/2006 | Ravi | 438/26 |
| 7,060,591 B2 | * | 6/2006 | Yamazaki et al. | 438/457 |
| 7,195,987 B2 | * | 3/2007 | Bae et al. | 438/406 |
| 7,198,671 B2 | * | 4/2007 | Ueda | 117/84 |
| 7,199,448 B2 | * | 4/2007 | Janke et al. | 257/618 |
| 7,262,112 B2 | * | 8/2007 | Xie | 438/457 |
| 7,368,307 B2 | * | 5/2008 | Cok | 438/26 |
| 7,410,888 B2 | * | 8/2008 | Knipe et al. | 438/478 |
| 7,550,052 B2 | * | 6/2009 | Fournel et al. | 156/160 |
| 7,575,982 B2 | * | 8/2009 | Bour et al. | 438/457 |
| 7,633,149 B2 | * | 12/2009 | Fischer et al. | 257/701 |
| 7,777,409 B2 | * | 8/2010 | Yamazaki et al. | 313/504 |
| 8,067,687 B2 | | 11/2011 | Wanlass | |
| 8,173,891 B2 | | 5/2012 | Wanlass | |
| 8,314,011 B2 | * | 11/2012 | Gmitter et al. | 438/458 |
| 2003/0017626 A1 | * | 1/2003 | Hilt et al. | 438/3 |
| 2005/0035514 A1 | * | 2/2005 | Hillman et al. | 269/21 |
| 2006/0144435 A1 | | 7/2006 | Wanlass | |

* cited by examiner

*Primary Examiner* — Scott B Geyer
(74) *Attorney, Agent, or Firm* — John C. Stolpa; W. LaNelle Owens

(57) ABSTRACT

A method of processing an epistructure or processing a semiconductor device including associating a conformal and flexible handle with the epistructure and removing the epistructure and handle as a unit from the parent substrate. The method further includes causing the epistructure and handle unit to conform to a shape that differs from the shape the epistructure otherwise inherently assumes upon removal from the parent substrate. A device prepared according to the disclosed methods.

19 Claims, 7 Drawing Sheets

METHODS OF MANIPULATING STRESSED EPISTRUCTURES

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Many semiconductor devices, including but not limited to optoelectronic devices such as photovoltaic cells, feature one or more layers of crystalline semiconductor materials epitaxially grown or deposited on a substrate. It may be desirable to facilitate subsequent processing steps or reduce overall substrate costs to epitaxially grow a crystalline layer or layers on a parent substrate and then remove the layers from the parent substrate for processing or association with a secondary substrate or superstrate.

Epitaxial growth of various types of semiconductor materials having desired characteristics may be readily accomplished when the epitaxial layers are lattice matched to the parent substrate or when subsequent layers are substantially lattice matched to underlying layers. Many semiconductor materials however, which have desired physical, optical or electrical characteristics are not inherently lattice matched with the substrates or underlying layers having attributes necessary for a device to function. Accordingly, a much broader range of semiconductor alloys is available for device design and fabrication if useful layers of lattice-mismatched semiconductor materials can be epitaxially grown and then processed into useful devices.

Excessive lattice mismatching in adjacent crystalline materials causes excessive lattice strain, which, when present to a sufficiently high degree, is usually manifested in the formation of dislocations, fractures, and other problems that degrade or destroy the electrical characteristics and capabilities of a device. Lattice mismatching may occur between an epitaxial layer and a parent substrate or between adjacent epitaxial layers. If the lattice-mismatched layers are carefully prepared from selected materials however, electrically useful layers can be fabricated.

Typically, the problems associated with extensive lattice mismatching can be controlled by growing compositionally graded layers, where the lattice-mismatch gradient is maintained below a critical value, for example less than 1% lattice mismatch per micron. Proper graded layer growth is sufficient to prevent excessive dislocations or fractures leading to a rough and unusable layer. However, graded lattice-mismatched layers will still have some degree of dislocation development. It is important to note that graded layers will not be fully relaxed by dislocation development. On the contrary, internal stress will still be present which will result in some degree of residual strain within the layers.

Alternatively, the problems associated with excessively lattice-mismatched layers, such as fractures and excess dislocations, can be mitigated by pseudomorphically growing one or more epitaxial layers to a thickness that is less than a critical thickness of the selected semiconductor alloy. In particular, a relatively thin mismatched epitaxial layer can be grown without excessive dislocation formation on an underlying layer provided the material parameters (e.g. layer thickness, elastic coefficients, etc.) are properly selected to maintain a coherent interface between the two layers under specific growth conditions. The term "coherent interface" is defined herein as an interface where an overlying epilayer takes on the same lattice constant as the underlying layer by elastic deformation, thus providing an interface which is functionally lattice matched, even though the respective lattice constants for each of the materials in bulk form may be substantially different.

Although the maintenance of a coherent interface may reduce or eliminate large scale problems such as fractures or dislocations, the elastic deformation for maintaining a coherent interface between lattice-mismatched epilayers may result in stress and compressive or tensile strain within the epilayers. Similarly, thicker lattice-mismatched layers prepared using a graded layer approach may have residual strain within the layers as discussed above.

This strain may cause bowing or curling of an epiwafer, which includes both the parent substrate and grown epilayers. In addition, the strain within lattice-mismatched epilayers may cause the epilayers to bow or curl if the parent growth substrate is selectively removed. Accordingly, flexible lattice-mismatched epistructures inherently settle into a more or less complex bowed state. Bowing or curling as used herein is defined broadly to encompass varying degrees of offset between the edges and center of a flexible epistructure. The degree of bowing is a function of epistructure area, the level of strain and other effects such as non-isotropic relaxation or thermal expansion.

Bowing may also occur in fully lattice-matched epistructures, particularly if the lattice-matched epistructures are removed from the parent substrate. Bowing in lattice-matched epistructures may be the result of thermal effects (e.g. differing coefficients of thermal expansion between layers) or stress induced by post-epitaxy processing steps such as metallization.

Epiwafer or epistructure bowing creates significant problems for device fabrication and device implementation. For example, it may be difficult to perform accurate lithography or other processing steps on a substantially non-flat, bowed, epiwafer or epistructure.

A typical epitaxially grown epistructure is deposited on a flat parent substrate. Generally, the parent substrate is substantially rigid, although it may be subject to bowing as described above. Certain devices may benefit from the implementation of an epistructure in a non-flat, for example cylindrical device. Highly curved epistructures are difficult to prepare directly.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY OF THE EMBODIMENTS

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment includes a method of processing an epistructure. As used herein, an "epistructure" is defined as one or more layers of semiconductor material epitaxially grown on a parent substrate. An epistructure is typically a thin, sheet-like structure. Since an epistructure is extremely thin, it is likely to be flexible even if the bulk epistructure material may be rigid or brittle if sufficiently thick. The method further includes associating a conformal and flexible handle with the epistructure. The handle may be associated with the epistructure by growing or depositing a handle directly upon the epistructure, or bonding a handle to the epistructure. This embodiment may also include removing the epistructure and handle as a unit from the parent substrate.

The epistructure and handle may be removed from the parent substrate by any known method, including but not limited to lapping, grinding, chemical etching, a combination of lapping and etching, or epitaxial lift off (ELO) techniques. The method further includes causing the epistructure and handle unit to conform to a shape that differs from the shape the epistructure otherwise inherently assumes upon removal from the parent substrate.

The step of causing the epistructure and handle to conform to a shape that differs from the shape the epistructure inherently assumes upon removal from the parent substrate may include flattening the epistructure and handle. Alternatively, the epistructure and handle may be made to conform to a shaped surface on a secondary substrate which differs from the inherent shape of the epistructure. In instances where the epistructure and handle are flattened, the combination may be flattened on an intermediate surface such as the face of a vacuum chuck. Alternatively, the epistructure and handle may be flattened by associating these structures with the flat surface of a secondary substrate.

An alternative embodiment is a semiconductor device prepared utilizing a flexible epistructure in combination with flexible and conformal handle as described above.

Another embodiment is a method of fabricating a semiconductor device which includes growing an epistructure upon a parent substrate, associating a conformal and flexible handle with the epistructure and removing the epistructure and handle as a unit from the parent substrate as described above. After removal, the epistructure and handle may be associated with a secondary substrate or secondary superstrate wherein a surface of the secondary substrate or secondary superstrate has a selected shape which is different from a shape the epistructure otherwise inherently assumes upon removal from the parent substrate.

The secondary substrate or superstrate may be flat or have a selected non-flat shape. The epistructure and handle may be associated with an intermediate surface after removal from the parent substrate. Various processing steps may be performed while the epistructure and handle are associated with the intermediate surface. For example, the epistructure and handle may be flattened upon an intermediate surface such as the face of a vacuum chuck during the performance of a selected processing step. After the intermediate processing steps are complete, the epistructure and handle may be associated with a secondary substrate or secondary superstrate. The handle may then be removed from the epistructure if desired. Alternatively, the handle may perform a secondary function within a device such as a back reflector or contact.

The methods disclosed herein are suitable for the fabrication of any type of semiconductor device. The disclosed methods are particularly well suited for the fabrication of a photovoltaic solar cell, including but not limited to a photovoltaic cell where epistructure layers include at least one layer of a selected group III-V semiconductor alloy.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
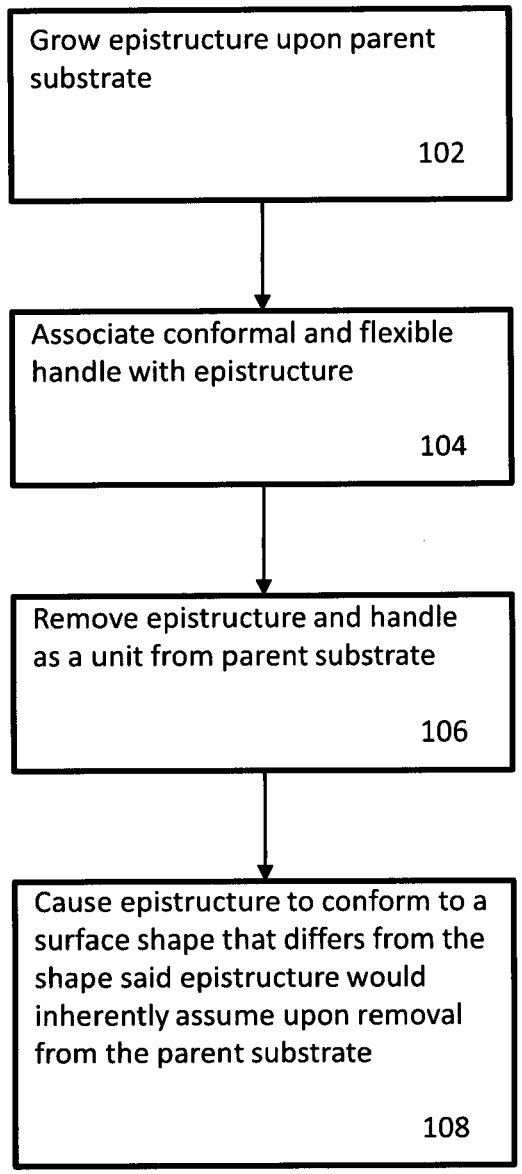
FIG. 1 is a flow chart representation of an exemplary method embodiment.

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "element" or "component" encompass both elements and components comprising one unit and elements and components that comprise more than one unit unless specifically stated otherwise. A material may be described herein as being "single crystal." Single crystal very specifically means an ingot, wafer or epilayer that is truly a single crystal, with no grain boundaries. "Crystalline" is a more general term for a substantially crystalline material which can have grain boundaries. Crystalline shall be understood to mean substantially crystalline, and having sufficiently well developed crystal structure that one skilled in the art refers to the material as being crystalline. The terms single crystal and crystalline do not mean absolutely defect free. Both types of material will have defects and or dislocations. Certain abbreviations may be made herein with respect to the description of semiconductor alloys. These abbreviations shall not be construed as limiting the scope of the disclosure or claims. For example, the form "InGaAlN" is a common abbreviation to improve readability in technical manuscripts. Abbreviated forms such as "InGaAlN" are defined as equivalent to an expanded form, for example; "$In_xGa_yAl_{1-x-y}N$".

As used herein, epitaxy, epitaxial and epitaxially are generally defined as relating to the process where one crystalline substance is grown or deposited on another crystalline substance. As used herein in relation to epitaxial processes, "grown and grow" are synonymous with "deposited and deposit".

One embodiment includes a method of processing an epistructure to manipulate the geometry of a stressed epistructure. As used herein, an "epistructure" is defined as one or multiple layers of semiconductor material epitaxially grown on a parent substrate. An epistructure is typically a thin sheet-like structure having a thickness of about 10 Å to 20 µm. Since an epistructure is extremely thin, it is likely to be flexible even if the bulk epistructure material is rigid or brittle. The parent substrate with the epistructures still attached will be referred to herein as an "epiwafer". The epistructure may be grown on the parent substrate through any known epitaxial growth method, including but not limited to a vapor-phase epitaxy (VPE), liquid-phase epitaxy (LPE), molecular beam epitaxy (MBE), metal organic chemical vapor deposition (MOCVD) and others.

Generally, epitaxial growth may occur where the epitaxial layers are lattice matched with the parent substrate and between layers, or in carefully controlled instances where the epitaxial layers are somewhat lattice mismatched with the parent substrate or adjacent layers. Subsequently grown epitaxial layers may be lattice matched or lattice mismatched with adjacent layers. A single device may have multiple layers some of which are lattice matched with adjacent layers and some of which are lattice mismatched.

Lattice-matched growth occurs where the lattice constant defined by the crystal structure of adjacent layers is substantially the same. On the contrary, lattice-mismatched growth occurs when the lattice constant of the crystalline materials of adjacent layers are different from each other. Excessive lattice mismatching in adjacent crystal layers will cause excessive lattice strain which when present to a sufficiently high degree, is usually manifested in the formation of dislocations, fractures and other problems that compromise the suitability of a highly lattice-mismatched layer for use in a device. If lattice-mismatched layers are carefully grown however, exceptionally useful functional layers may be fabricated.

Typically, the problems associated with extensive lattice mismatching can be controlled by growing compositionally graded layers, where the lattice-mismatch gradient is maintained below a critical value, for example less than 1% lattice mismatch per micron. Proper graded layer growth is sufficient to prevent excessive dislocations or fractures leading to a rough and unusable layer. However, graded lattice-mismatched layers may still have some degree of dislocation development. It is noted that graded layers may not be fully relaxed by dislocation development. On the contrary, internal stress may still be present which may result in some degree of residual strain within the layers.

Alternatively, the problems associated with excessively lattice-mismatched layers, such as fractures and excess dislocations, can be mitigated by pseudomorphically growing one or more epitaxial layers to a thickness that is less than a critical thickness of the selected semiconductor alloy. In particular, a relatively thin mismatched epitaxial layer can be grown without excessive dislocation formation on an underlying layer provided the material parameters (e.g. layer thickness, elastic coefficients, etc.) are properly selected to maintain a coherent interface between the two layers under specific growth conditions. The term "coherent interface" is defined herein as an interface where an overlying epilayer takes on the same lattice constant as the underlying layer by elastic deformation, thus providing an interface which is functionally lattice matched, even though the respective lattice constants for each of the materials in bulk form may be substantially different.

One unavoidable result of elastic deformation of the crystal lattice or incomplete relaxation through dislocation formation is biaxial strain within the plane defined by the epilayer or epilayers. This biaxial strain is compressive, if the lattice constant of an epilayer material in bulk form is larger than the lattice constant of the parent substrate or underlying layer. Compressive biaxial strain may cause an epistructure or epiwafer to bow in a convex manner with respect to the substrate. Alternatively, the biaxial strain may be tensile, if the epistructure has a smaller lattice constant than the underlying layer or parent substrate. Tensile biaxial strain may result in concave bowing with respect to the substrate.

In certain instances, epistructure strain may be great enough to bow or curl the entire epiwafer, which includes both the epistructure and the parent substrate. Alternatively, the parent substrate may be of sufficient thickness and rigidity to essentially prevent epiwafer bowing. In this case however, separation of the epistructure from the parent substrate may allow the free standing epistructure to bow or curl as a result of strain. More complex bowing can also occur in either lattice-mismatched or lattice-matched epistructures due to miscellaneous effects such as non-isotropic relaxation, thermal expansion mismatches, the effect of subsequent processing steps, or other causes.

A bowed epistructure or a bowed epiwafer can cause substantial problems with many subsequent processing steps. For example, it may be difficult or impossible to implement a lithography processing step with a bowed, non-flat wafer since a typical lithography mask is flat. The resolution of a lithography system is controlled by maintaining a uniform and specific gap between the lithography mask and layer(s) being processed, thus epiwafer or epistructure bowing compromise the lithography process.

Alternatively, it may be desirable to associate a flexible epistructure prepared on a substantially flat substrate with a shaped device, for example a cylinder or cone. The methods disclosed herein address each of these problems.

Figure 2:
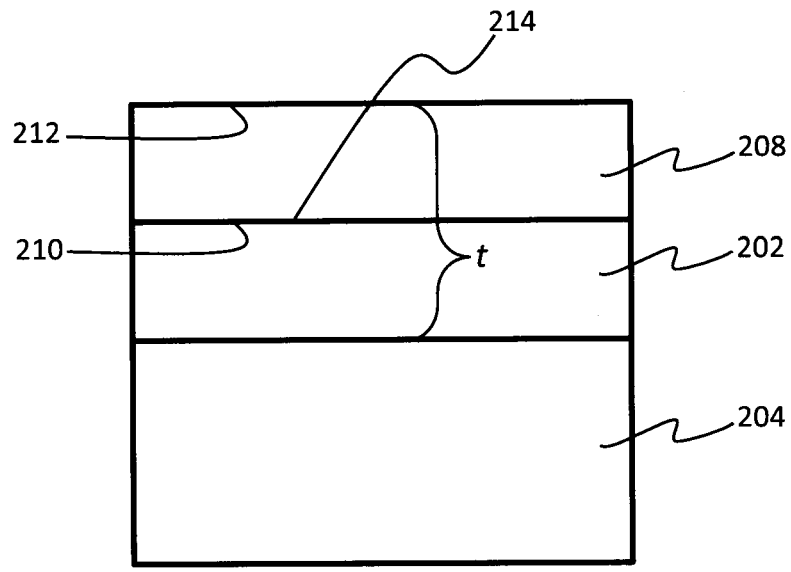
FIG. 2 is a schematic representation of an exemplary epistructure, handle and parent substrate.
Figure 3:
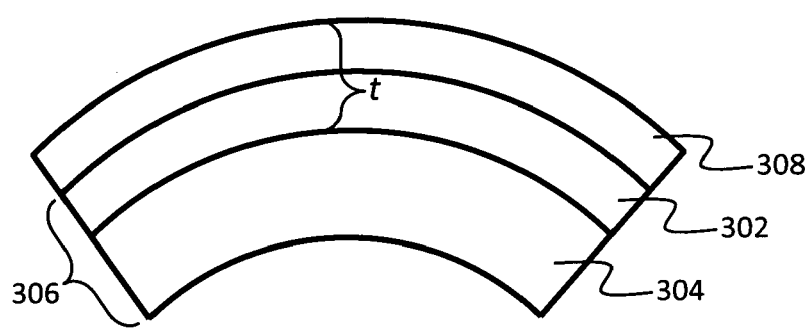
FIG. 3 is a schematic representation of an exemplary epistructure, handle and parent substrate showing epiwafer bowing.

As illustrated in flow chart form on FIG. 1, one embodiment is a method of processing an epistructure which includes growing an epistructure on a parent substrate (step 102). As schematically shown in FIG. 2, an epistructure 202 may be one or more layers of semiconductor material epitaxially grown on parent substrate 204. As described above, the epistructure 202 may have strain which is insufficient to manifest in appreciable epiwafer bowing if the parent substrate 204 is sufficiently thick and rigid. Alternatively, as shown in FIG. 3 an epistructure 302 may have sufficient strain to bow the parent substrate 304 and thus the entire epiwafer 306.

The problems inherent in the subsequent processing of a bowed epiwafer or bowed epistructure may be addressed by associating a conformal and flexible handle 208, 308 with the epistructure 202, 302 (step 104, FIG. 1). A conformal and flexible handle must be both conformal and flexible. As used herein, the term "flexible" is defined as being elastically deformable without appreciable damage to the flexible element. The handle 208 must be flexible. In addition, the epistructure 202 must be flexible if separated from the parent substrate. In certain instances, for example the parent substrate 304 may be relatively thin and flexible as well.

"Conformal" as used herein generally means that the handle 208 must fully conform to the shape of the epistructure 202. Specifically this definition includes that the handle 208 have a first surface 210 adjacent to the epistructure 202 and a second surface 212 opposite the epistructure 202 which surfaces are substantially parallel to the outer surface 214 of the epistructure 202. Thus, that the handle 208 be "conformal" also means that the thickness (t) of the epistructure 202 and handle 208 together be substantially constant over the surface area of the substantially sheet-like handle and epistructure.

The handle 208 may be fabricated or made from any suitable flexible and conformable material, including but not limited to a metal layer, a plastic layer, a dielectric layer, a polymer layer, a resin layer or another semiconductor layer. In all cases the handle 208 must be at least initially bonded or innately affixed to the epistructure 202 such that the handle and epistructure may be manipulated as a single unit. Thus, the conformal and flexible handle 208 may be grown or deposited directly upon the epistructure 202. Alternatively, the handle 208 may be bonded to the epistructure 202 with an adhesive such as a solder or epoxy resin.

The primary purpose of the handle 202 with respect to the epistructure bowing problem, or the problem of manipulating epistructures into desired shapes, is to provide structural support to the relatively delicate epistructure, particularly after the epistructure is removed from the parent substrate. The handle 202 may also have other functionality in any device fabricated with the epistructure.

After the handle 208 is associated with the epistructure 202, the handle and epistructure may be selectively removed as a unit from the parent substrate 204 for further processing. Such further processing may include any number of device fabrication steps, including but not limited to etching, lithography, diffusion, additional epitaxial growth steps, contact formation, the application of reflective or other optical surfaces, that application of protective surfaces, metallization, or other steps. In all embodiments however, the epistructure 202 may be caused to conform to a shape which differs from the shape said epistructure may have inherently assumed upon removal from the parent substrate (step 108).

It may be noted that the epistructure 202 and handle 208 are substantially sheet-like structures having a width and length which are substantially greater than the thickness of these structures. Naturally the epistructure 202 and handle 208 have exterior edges along the width and length. As used herein, "causing the epistructure to conform to a shape." does not involve shaping the edges of this substantially sheet-like shape. The edges may be shaped or trimmed as desired, however "causing the epistructure to conform to a shape." is specifically defined as bending or deflecting the position of selected portions of the sheet-like structure relative to other portions of the sheet-like structure. For example, flattening a warped or bowed epistructure and handle is one manner of causing the epistructure to conform to a shape. Similarly wrapping a substantially flat epistructure and handle around a cylinder is another method of causing the epistructure to conform to a shape. The epistructure and handle unit may be visualized as analogous to a sheet of paper. The methods disclosed herein are analogous to flattening a curled sheet of paper, or wrapping the paper around a shape such as a cone or cylinder. The methods may, but do not necessarily involve trimming or cutting the edges of the epistructure and handle unit in a manner similar to cutting a shape from a sheet of paper.

The epistructure and handle may be removed as a unit from the parent substrate by any known method. The parent substrate may be preserved or destroyed. For example, the parent substrate may be lapped or ground away from the epistructure, the parent substrate may be removed by chemical etching techniques, or the parent may be removed with a combination of lapping and etching. In these instances the substrate may be destroyed. Alternatively the epistructure 202 and handle 208 may be removed from the parent substrate 204 using known epitaxial lift off (ELO) techniques typically featuring a release layer, which may preserve the substrate.

Figure 4:
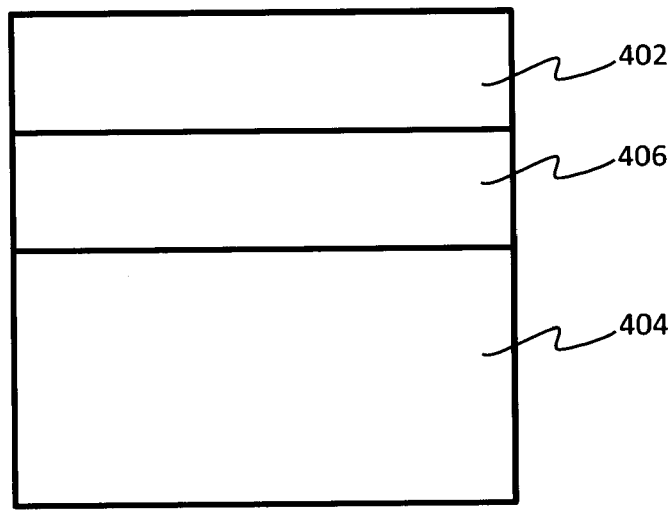
FIG. 4 is a schematic representation of an exemplary epistructure and handle associated with a secondary substrate.
Figure 5:
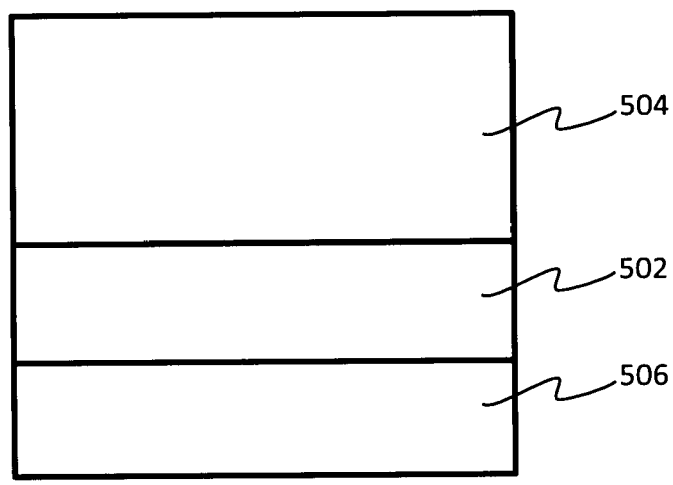
FIG. 5 is a schematic representation of an exemplary epistructure and handle associated with a secondary superstrate.

As described above, the inherent shape of the epistructure may be bowed, warped, curled or otherwise not flat. Accordingly, the epistructure may be flattened for additional processing steps. Flattening may occur by placing the epistructure and associated conformal and flexible handle on the flat surface of a vacuum chuck and drawing a vacuum to flatten the epistructure and handle against the chuck surface. Alternatively, flattening may occur by associating the epistructure and handle with a flat secondary substrate or superstrate. As used herein and shown in FIG. 4, a secondary substrate 404 is defined as underlying the epistructure 402. Thus, in embodiments where the epistructure 402 is associated with a secondary substrate 404 the handle 406 may be positioned between the epistructure 402, and the secondary substrate 404. Alternatively, as shown in FIG. 5, the epistructure 502 may be associated with a secondary superstrate 504 with the handle 506 opposite the secondary superstrate 504. In a secondary superstrate embodiment, the handle 506 may serve a secondary function as a back contact, rear reflector or other device layer. Alternatively the handle may be removed after the epistructure is associated with the secondary superstrate.

Figure 6:
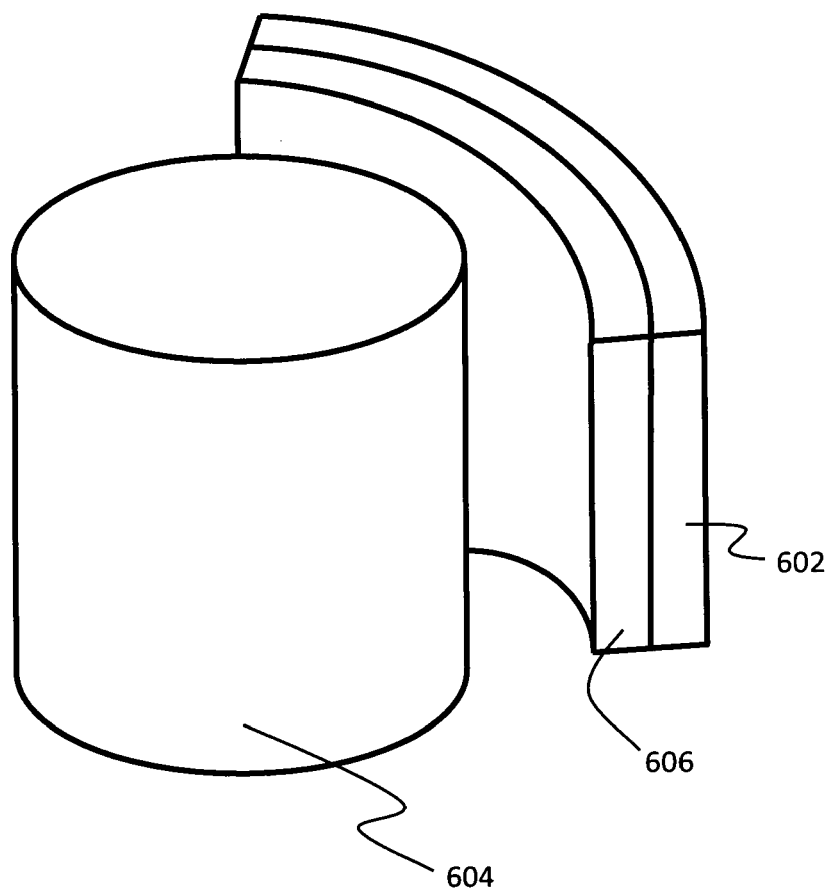
FIG. 6 is a schematic representation of an exemplary flexible epistructure associated with a flexible and conformal handle being made to conform to a secondary substrate having a select shape.

The epistructure and associated handle may alternatively be caused to conform to a shape defined by a secondary substrate or secondary superstrate which is not flat, but still different from the shape the epistructure may have inherently assumed upon removal from the parent substrate. For example, as illustrate in FIG. 6 the epistructure 602 and handle 606 may be associated with a cylindrical secondary substrate 604.

Figure 7:
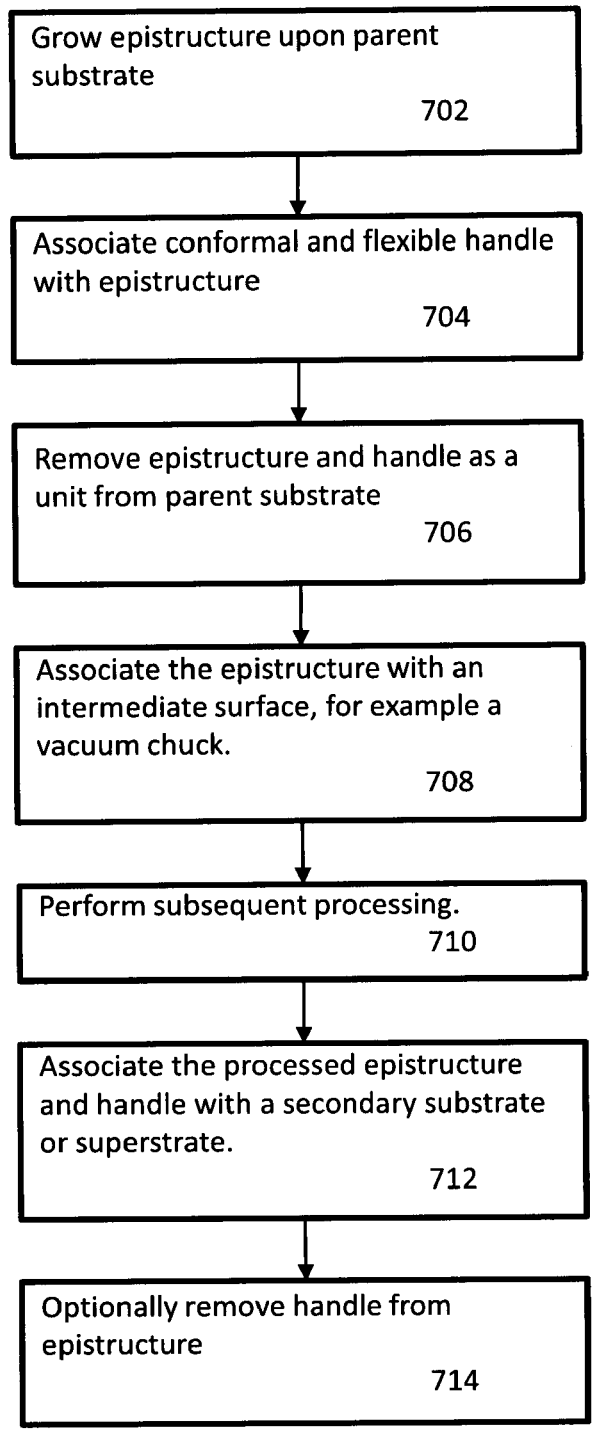
FIG. 7 is a flow chart representation of an exemplary method embodiment.

The techniques described above may be implemented individually or in combination. For example, as shown on FIG. 7, the epistructure and associated handle may initially be processed as described above (steps 702-706). After removal from the parent substrate, subsequent processing may occur on an intermediate surface which has a shape which is different from the shape the epistructure may have inherently assumed upon removal from the parents substrate. For example, as shown on FIG. 7, the handle and epistructure may be placed on a vacuum chuck to be flattened and then subjected to one or several processing steps such as described above (Steps 708 and 710). Subsequently, the processed epistructure and handle may be associated with a secondary substrate or superstrate having a specific shape for device fabrication or additional processing (step 712). The handle may be removed after the epistructure is associated with a secondary substrate or superstrate (Step 714).

Figure 8A:
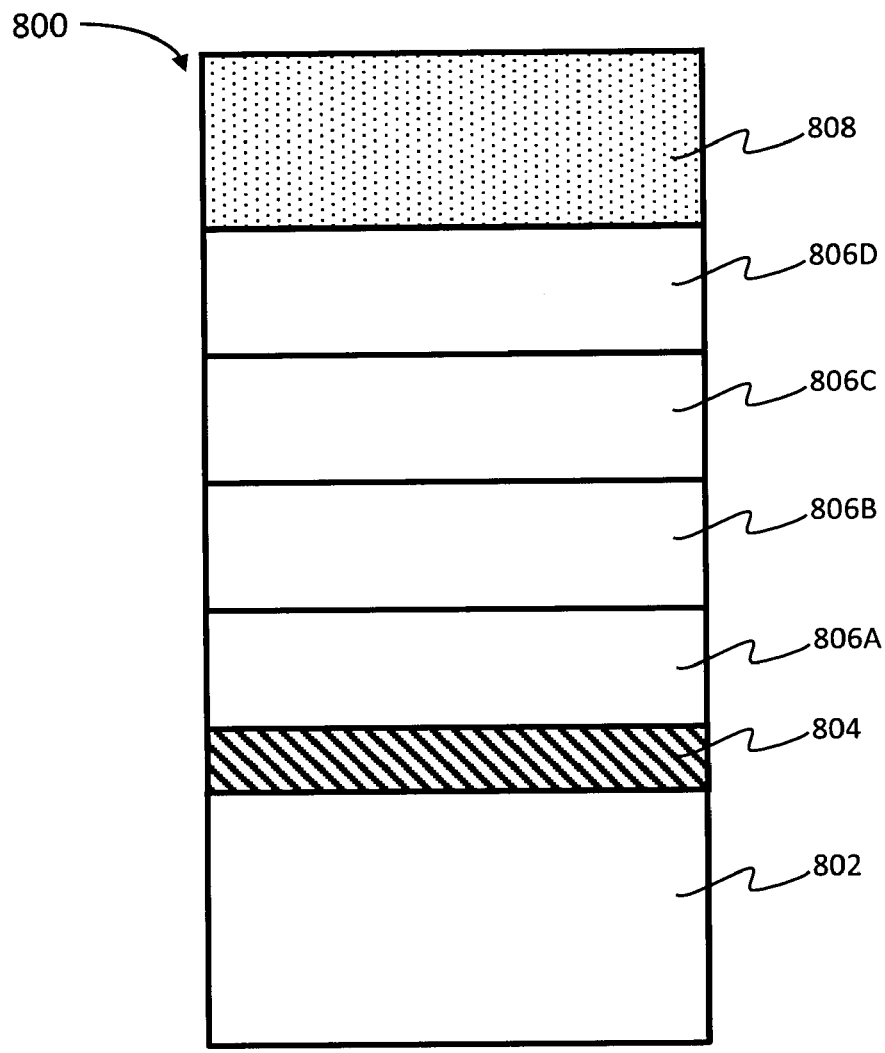
FIG. 8A is a schematic representation of an exemplary device under preparation, prior to removal of the epistructure and handle from a parent substrate.

The methods described above may be used to fabricate any type of semiconductor device. These methods are particularly well suited however to the fabrication of a photovoltaic cell which features multiple epitaxially grown layers of selected group III-V semiconductor alloys. In certain photovoltaic cell designs, it is advantageous or necessary to initially grow epilayers adjacent to the parent substrate. These layers that are grown adjacent to the parent substrate may ultimately be deployed toward the sun. For example, as shown in FIG. 8A, a portion of a device 800 during initial preparation steps may include a parent substrate 802 with an etch stop layer 804 initially grown thereon. Multiple device layers 806 A-D may be grown on the on the etch stop layer 804 and the device layers 806 A-D may be lattice mismatched with the etch stop layer 804 or between device layers. In the FIG. 8A embodiment device layer 806A is, by design, intended to be deployed toward the sun in the final device configuration. Accordingly, layers 806A-D must be removed from the parent substrate for final device fabrication. As noted above, at least some of layers A-D are lattice mismatched. Therefore, these layers are biaxially strained and may bow or curl upon removal from the parent substrate, limiting subsequent processing options.

Figure 8B:
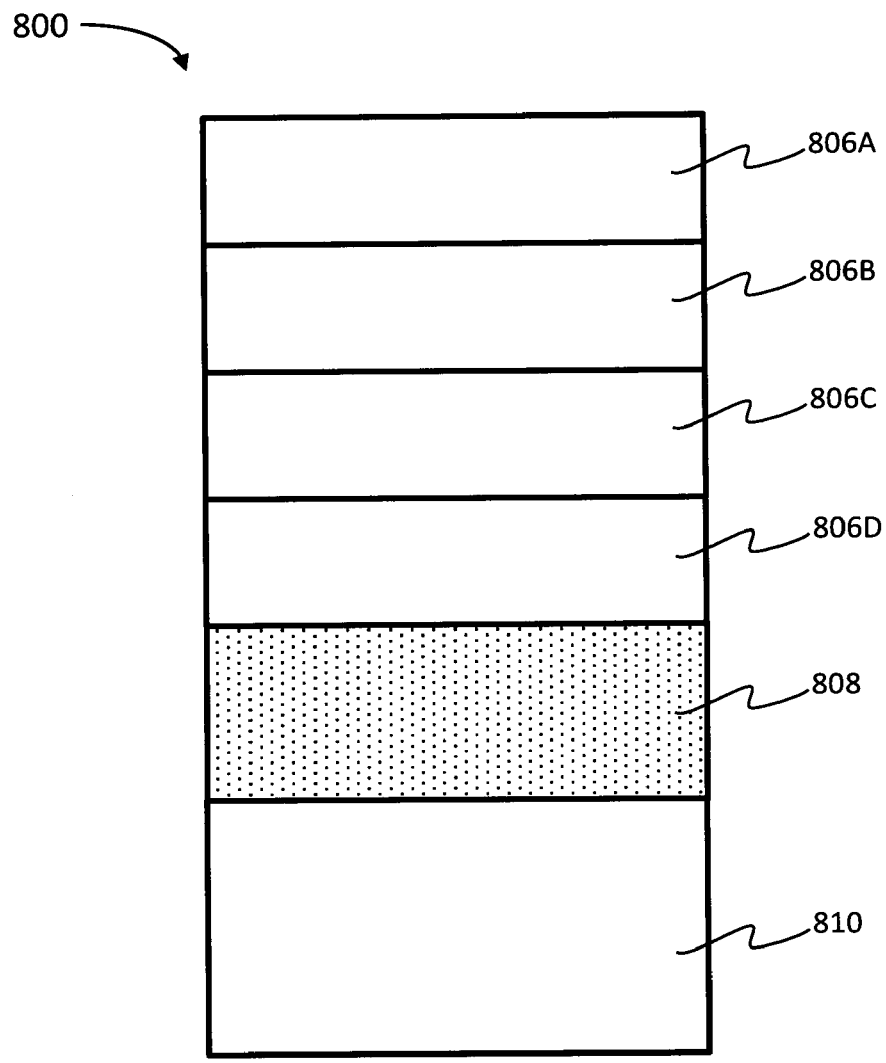
FIG. 8B is a schematic representation of an exemplary device after the association of an epistructure and handle with a secondary substrate.

This problem may be addressed by applying a flexible conformal handle 808 to layer 806D prior to removing the parent substrate 802. The parent substrate 802 may be removed by selective chemical etching which is facilitated by the etch stop layer 804. Alternatively, the layers above the substrate may be removed by epitaxial lift off (ELO) techniques. Subsequently the epistructure layers 806 and associated handle may be flattened as described above for further processing and/or associated with at secondary substrate 810 a shown in FIG. 8B. In the embodiment of FIG. 8B, the handle is bonded to the secondary substrate 810 and can serve a secondary purpose such as a rear reflective surface, electrical contact or other purpose.

Various embodiments of the disclosure may also include permutations of the various elements recited in the claims as if each dependent claim was a multiple dependent claim incorporating the limitations of each of the preceding dependent claims as well as the independent claims. Such permutations are expressly within the scope of this disclosure.

While number of embodiments are particularly shown and described, it is understood by those skilled in the art that changes in the form and details may be made to the various embodiments disclosed herein without departing from the spirit and scope of the claims and that the various embodiments disclosed herein are not intended to act as limitations on the scope of the claims. All references cited herein are incorporated in their entirety by reference.

The description herein is presented for purposes of illustration and description, but is not intended to be exhaustive or limiting to the form disclosed. The scope is limited only by the scope of the following claims. Many modifications and variations will be apparent to those of ordinary skill in the art. The embodiment described and shown in the figures was chosen and described in order to best explain the principles herein, the practical application, and to enable others of ordinary skill in the art to understand the various embodiments with various modifications as are suited to the particular use contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method of processing an epistructure comprising:
   growing an epistructure upon a parent substrate;
   associating a conformal and flexible handle with the epistructure, wherein the handle comprises at least one of a flexible and conformal metal layer, a flexible and conformal plastic layer, a flexible and conformal dielectric layer, a flexible and conformal polymer layer, a flexible and conformal resin layer and a flexible and conformal semiconductor layer;
   removing the epistructure and handle as a unit from the parent substrate; and
   causing the epistructure and handle unit to conform to a shape that differs from the shape said epistructure otherwise inherently assumes upon removal from the parent substrate.

2. The method of processing an epistructure of claim 1 further comprising flattening the epistructure and handle unit.

3. The method of processing an epistructure of claim 2 further comprising flattening the epistructure and handle unit on a vacuum chuck.

4. The method of processing an epistructure of claim 2 further comprising associating the epistructure and handle unit with a flat secondary substrate or superstrate.

5. The method of processing an epistructure of claim 1 further comprising associating the handle with the epistructure with an intermediate bonding material.

6. The method of processing an epistructure of claim 1 wherein the epistructure comprises at least one layer of semiconductor material which is substantially lattice mismatched with the parent substrate.

7. The method of processing an epistructure of claim 1 wherein the epistructure comprises at least two layers of semiconductor material which are substantially lattice mismatched with each other.

8. The method of processing an epistructure of claim 1 wherein the epistructure comprises at least one layer of a selected Group III-V semiconductor alloy.

9. A method of fabricating a semiconductor device comprising:
   growing an epistructure upon a parent substrate;
   associating a conformal and flexible handle with the epistructure, wherein the handle comprises at least one of a flexible and conformal metal layer, a flexible and conformal plastic layer, a flexible and conformal dielectric layer, a flexible and conformal polymer layer, a flexible and conformal resin layer and a flexible and conformal semiconductor layer;
   removing the epistructure and handle as a unit from the parent substrate; and
   associating the epistructure and handle unit with a surface of one of a secondary substrate and a secondary superstrate wherein the surface has a selected shape which is different from a shape said epistructure otherwise inherently assumes upon removal from the parent substrate.

10. The method of fabricating a semiconductor device of claim 9 further comprising flattening the epistructure and handle unit.

11. The method of fabricating a semiconductor device of claim 9 further comprising associating the handle with the epistructure with an intermediate bonding material.

12. The method of fabricating a semiconductor device of claim 9 wherein the epistructure comprises at least one layer of semiconductor material which is substantially lattice mismatched with the parent substrate.

13. The method of fabricating a semiconductor device of claim 9 wherein the epistructure comprises at least two layers of semiconductor materials which are substantially lattice mismatched with each other.

14. The method of fabricating a semiconductor device of claim 9 further comprising removing the epistructure and handle from the parent substrate by at least one of chemical etching, lapping, a combination of lapping and etching, and ELO.

15. The method of fabricating a semiconductor device of claim 9 further comprising:
   associating the epistructure and handle unit with an intermediate surface after removal from the parent substrate and before attaching the epistructure to a secondary substrate or superstrate, which intermediate surface has a shape which is different from the shape said epistructure otherwise inherently assumes upon removal from the parent substrate; and performing a processing step upon the epistructure while the epistructure is associated with the intermediate surface.

16. The method of fabricating a semiconductor device of claim 15 wherein the intermediate surface is a vacuum chuck.

17. The method of fabricating a semiconductor device of claim 15 further comprising flattening the epistructure and handle unit on the intermediate surface.

18. The method of fabricating a semiconductor device of claim 9 wherein the epistructure comprises at least one layer of a selected Group III-V semiconductor alloy.

19. The method of fabricating a semiconductor device of claim 9 wherein the device is a photovoltaic cell.

* * * * *